(12) United States Patent
Atokawa

(10) Patent No.: US 6,483,399 B1
(45) Date of Patent: Nov. 19, 2002

(54) DUPLEXER AND COMMUNICATION APPARATUS WITH FIRST AND SECOND FILTERS, THE SECOND FILTER HAVING PLURAL SWITCH SELECTABLE SAW FILTERS

(75) Inventor: Masayuki Atokawa, Kanazawa (JP)

(73) Assignee: Murata Manufacturing Co., Ltd. (JP)

( * ) Notice: Subject to any disclaimer, the term of this patent is extended or adjusted under 35 U.S.C. 154(b) by 14 days.

(21) Appl. No.: 09/667,172

(22) Filed: Sep. 21, 2000

(30) Foreign Application Priority Data

Sep. 21, 1999 (JP) .......................... 11-267010

(51) Int. Cl.[7] .................. H03H 9/72; H01P 1/213
(52) U.S. Cl. .................. 333/133; 333/193; 333/134; 333/101; 455/78; 455/83
(58) Field of Search .................. 333/133, 193–196, 333/101, 104, 103; 134; 455/78, 83

(56) References Cited

U.S. PATENT DOCUMENTS

| | | | |
|---|---|---|---|
| 5,065,120 A | * 11/1991 | Munn | 333/134 X |
| 5,365,207 A | * 11/1994 | Borras et al. | 333/196 |
| 5,442,812 A | * 8/1995 | Ishizaki et al. | 333/104 X |
| 5,515,015 A | * 5/1996 | Nakata | 333/133 X |
| 6,308,051 B1 | * 10/2001 | Atokawa | 333/207 X |

FOREIGN PATENT DOCUMENTS

| | | | |
|---|---|---|---|
| EP | 0910 132 A2 | * | 4/1999 |
| JP | 595204 | | 4/1993 |
| JP | 5175879 | | 7/1993 |
| JP | 11-122139 | * | 4/1999 |
| JP | 2000/353976 | * | 12/2000 |
| KR | 1999-37171 | | 5/1999 |
| WO | 00/44102 | * | 7/2000 |

OTHER PUBLICATIONS

Korean Office Action dated Jul. 2, 2002, along with an English translation.

* cited by examiner

Primary Examiner—Benny Lee
Assistant Examiner—Barbara Summons
(74) Attorney, Agent, or Firm—Ostrolenk, Faber, Gerb & Soffen, LLP

(57) ABSTRACT

A duplexer and a communication apparatus incorporating the same which are suitable for use in communication systems with wide frequency bands and narrow separations, and which can be miniaturized while having satisfactory characteristics. The duplexer has a transmission filter constituted of a variable frequency filter in which PIN diodes are connected to dielectric resonators and a reception filter constituted of two surface acoustic wave filters and a switching circuit. In the transmission filter, one of the higher and lower sides of a transmission frequency band can be selected according to a voltage applied to a first voltage control terminal. In addition, in the reception filter, one of the two surface acoustic wave filters can be selected according to a voltage applied to a second voltage control terminal.

13 Claims, 4 Drawing Sheets

DUPLEXER AND COMMUNICATION APPARATUS WITH FIRST AND SECOND FILTERS, THE SECOND FILTER HAVING PLURAL SWITCH SELECTABLE SAW FILTERS

BACKGROUND OF THE INVENTION

1. Field of the Invention

The present invention relates to duplexers suitable for use in high frequency bands such as a microwave band, and the invention also relates to communication apparatuses incorporating the same.

2. Description of the Related Art

Recently, with a rapid expansion in miniaturization of mobile communication apparatuses such as cellular phones, there has been a growing demand for miniaturization of duplexers incorporated in the mobile communication apparatuses.

A conventional type of duplexer uses variable frequency filters as a transmission filter and a reception filter. In this case, each of the variable frequency filters has a structure in which dielectric resonators are connected to variable impedance elements such as PIN diodes via reactance elements such as capacitors. With this structure, resonant frequencies can be varied by controlling voltages applied to the variable impedance elements. In addition, in the duplexer incorporating the variable frequency filters, the size of the duplexer is reduced by decreasing the number of the dielectric resonators of the transmission filter and the reception filter.

However, when variable frequency filters are used both as the transmission filter and the reception filter in the duplexer, although miniaturization of the duplexer can be achieved to some extent, there is still a limit to the miniaturization, since dielectric resonators are used both in the transmission filter and the reception filter. Specifically, since the dielectric resonators need to have certain lengths for use at the intended frequencies, it is difficult to miniaturize the duplexer.

Meanwhile, in duplexers disclosed in Japanese Unexamined Patent Application Publication No. 5-95204 and Japanese Unexamined Patent Application Publication No. 5-175879, dielectric filters are used in the transmission filters and surface acoustic wave filters are used in the reception filters. In such duplexers, the surface acoustic wave filters used in the reception filters are smaller than dielectric filters. Thus, the sizes of the duplexers are reduced.

By using surface acoustic wave filters as both the reception filters and the transmission filters, the duplexers could be made smaller. However, usually, since a surface acoustic wave filter has a power rating lower than that of a dielectric filter, it would be difficult to use such a surface acoustic wave filter as a transmission filter, which receives a large amount of electrical power.

In addition, in the Japanese cdma-One cellular phone system, transmission frequencies are allocated in a range of 887 to 925 MHZ, and reception frequencies are allocated in a range of 832 to 870 MHZ. That is, the width of each of the transmission and reception frequency bands is 38 MHZ, which is relatively broad, and the separation bandwidth between the transmission side and the reception side frequencies is 17 MHZ, which is relatively narrow.

In the duplexers of Japanese Unexamined Patent Application Publication No. 5-95204 and Japanese Unexamined Patent Application Publication No. 5-175879, the surface acoustic wave filters are used in the reception filters, and can be miniaturized to some extent. However, due to characteristics of the surface acoustic wave filters, it is difficult to apply the surface acoustic wave filters in broad band applications such as the cdma-One system. Furthermore, even if the bandwidth of the surface acoustic wave filter could be broadened, it would be difficult to obtain a large amount of attenuation, and it would also be difficult to perform phase synthesis with the transmission filter, that is, it would be difficult to provide zero impedance in the transmission frequency band. As a result, particularly, transmission characteristics would be deteriorated.

SUMMARY OF THE INVENTION

Accordingly, it is an object of the present invention to provide a compact duplexer suitable for use in communication systems of broad bandwidths with narrow separations, while having good characteristics. It is another object of the present invention to provide a communication apparatus incorporating the duplexer.

According to a first aspect of the present invention, there is provided a duplexer including a first filter having a variable frequency filter formed by connecting a variable impedance element to a dielectric resonator, and a second filter having a plurality of surface acoustic wave filters with mutually different frequency pass bands and a switching circuit for selecting one of the plurality of surface acoustic wave filters.

In this duplexer, one of a plurality of frequency bands can be selected, in the first filter, by controlling the variable impedance element; and in the second filter, by selecting one of the surface acoustic wave filters having different pass bands via the switching circuit.

In this case, the switching circuit may be connected either to the inputs of the surface acoustic wave filters or to both the inputs and outputs thereof.

With the above arrangement, each of the first and second filters can be adapted to the frequency of the counterpart filter by switching the frequency passbands of the first and second filters, respectively. In other words, in effect, the transmission frequency band and the reception frequency band are both narrowed and the separation between both bands is broadened. Thus, narrow band surface acoustic wave filters can be used. As a result, a duplexer having a sufficient amount of attenuation and satisfactory characteristics can be obtained.

Furthermore, by using the switching circuit to select one of the plurality of surface acoustic wave filters, the transmission and reception frequency bands are both narrowed, whereby phase synthesis with the counterpart filter can be easily and satisfactorily performed. In addition, since deterioration of transmission characteristics and reception characteristics due to mismatching of phase synthesis can be prevented, satisfactory transmission/reception characteristics can be obtained.

That is, since the variable frequency filter is used in the first filter and surface acoustic wave filters are used in the second filter, miniaturization of the duplexer can be achieved and characteristics suitable for use in the communication system with broad band width and narrow separation can be obtained.

The plurality of surface acoustic wave filters used in the duplexer according to the present invention include not only surface acoustic wave filters with entirely different frequency pass bands but also surface acoustic wave filters with frequency pass bands that partially overlap within the overall range of the frequency pass bands.

In addition, generally, it is preferable to use a filter including dielectric resonators, which has a high power rating, as the transmission filter to which is applied high power, and a filter including surface acoustic wave filters, which has a low power rating, as the reception filter which receives low-power signals.

In addition, the first filter may be formed as a band elimination filter, and the second filter may be formed as a band pass filter. A PIN diode may be used as the variable impedance element of the first filter, and a switching circuit formed by a PIN diode or a GaAs switch may be used as the switching circuit of the second filter.

Furthermore, the first and second filters may be disposed together on the same substrate to be integrated with each other. As a result, easy handling can be achieved, and stable and satisfactory characteristics can be obtained.

According to a second aspect of the present invention, there is provided a communication apparatus including the dielectric filter or the duplexer having the characteristics described above. Thus, the communication apparatus can be compact and can have satisfactory characteristics.

Other features and advantages of the present invention will become apparent from the following description of the invention which refers to the accompanying drawings.

DESCRIPTION OF EMBODIMENTS OF THE INVENTION

Figure 1:
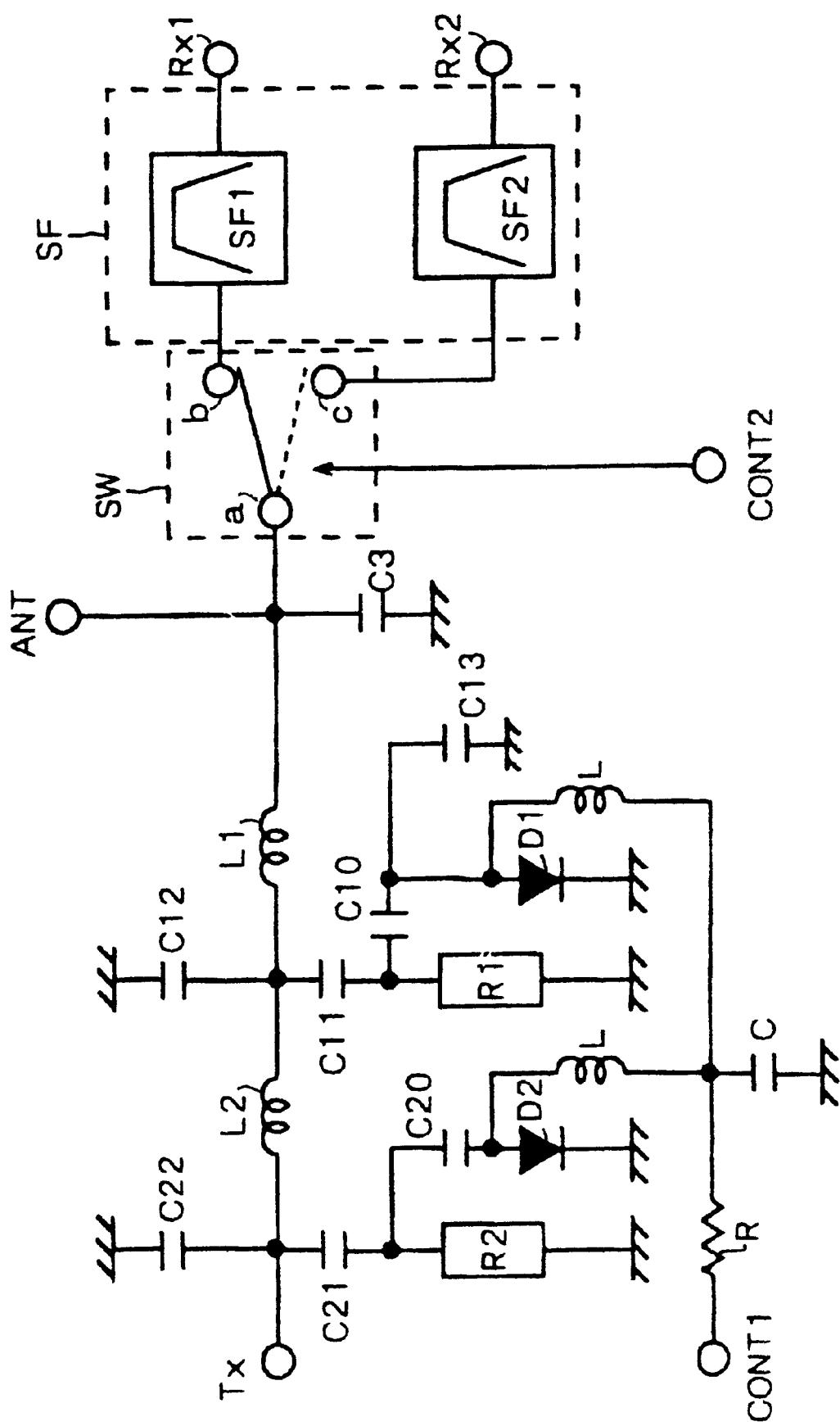
FIG. 1 is a circuit diagram of a duplexer according to a first embodiment of the present invention.

FIG. 1 is a circuit diagram of a duplexer according to a first embodiment of the present invention.

In this duplexer, the respective frequency bands of a transmitted signal and a received signal are each divided into a higher band and a lower band. The duplexer has a first filter constituted of a variable frequency filter, and a second filter constituted of two surface acoustic wave filters and a switching circuit.

The first filter is formed as a transmission filter, and passes signals of one of the higher and lower sides of the transmission frequency band according to a voltage applied to a voltage control terminal CONT1. The second filter is formed as a reception filter, and passes signals of one of the higher and lower sides of the reception frequency band according to a voltage applied to a voltage control terminal CONT2.

The transmission filter includes dielectric resonators R1 and R2. An end of each of the dielectric resonators R1 and R2 is grounded. The other end of each of them is grounded via capacitors C11, C12, C21, and C22. An inductor L2 is disposed between the junction of the capacitors C11 and C12 and the junction of the capacitors C21 and C22. With this arrangement, a band elimination filter (BEF) is formed. In the band elimination filter, attenuation poles are formed by two resonant frequencies of a resonator system constituted of the dielectric resonator R1 and the capacitor C11 and a resonator system constituted of the dielectric resonator R2 and the capacitor C21.

The junction of the capacitors C21 and C22 is connected to a transmission terminal Tx. An inductor L1 is disposed between the junction of capacitors C11 and C12 and an antenna terminal ANT, and a capacitor C3 is disposed between the antenna terminal ANT and a ground. The phase synthesis provided by the inductor L1 and the capacitor C3 is such that the reflection phase is open in the pass band of the reception filter. A series circuit constituted of a PIN diode D1 and a capacitor C10, and a series circuit constituted of a PIN diode D2 and a capacitor C20 are connected respectively between the dielectric resonators R1 and R2 of the transmission filter and ground. High frequency blocking circuits each constituted of an inductor L, a resistor R, and a capacitor C, are respectively disposed between the voltage control terminal CONT1, and the PIN diodes D1 and D2. With this arrangement, since the number of dielectric resonators can be reduced, the transmission filter can be miniaturized.

A capacitor C13 disposed between the PIN diode D1 and ground serves to correct distortion characteristics. The dielectric resonators R1 and R2 are constituted of cylindrical dielectric members, outer conductors formed on the outer peripheral surfaces of the cylindrical dielectric members, and inner conductors formed on the inner peripheral surfaces thereof. Each of the dielectric resonators R1 and R2 is a $\lambda/4$-type dielectric coaxial resonator, in which one end of the resonator is open-circuited and the other end thereof is short-circuited.

The reception filter has two surface acoustic wave filters SF1 and SF2, and a switching circuit SW. The antenna terminal ANT is connected to a common end a of the switching circuit SW. The input terminals of the surface acoustic wave filters SF1 and SF2 are connected to contact points b and c of the switching circuit SW, respectively. The surface acoustic wave filters SF1 and SF2 are band pass filters (BPF). In this case, for example, both of the filters SF1 and SF2 can be part of a surface acoustic wave filter device SF including two inputs and two outputs and contained in a single case. With such an arrangement of the surface acoustic wave filters, the reception filter can be greatly miniaturized.

Figure 2:
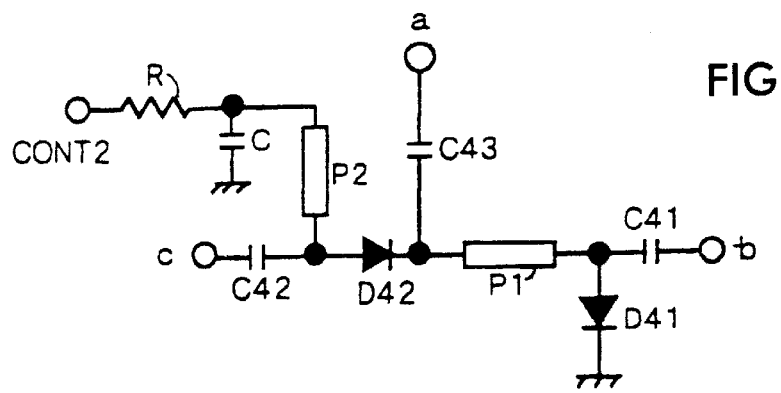
FIG. 2 is a circuit diagram of an example of a switching circuit used in the duplexer according to the first embodiment.

In the reception filter, the switching circuit SW has a voltage control terminal CONT2, which applies a voltage to perform switching between the contact points b and c. FIG. 2 is an example of a switching circuit that can be used. In FIG. 2, reference characters a, b, and c correspond to those shown in FIG. 1. In the switching circuit SW shown in FIG. 2, a capacitor C41, a $\lambda/4$ phase circuit P1, a PIN diode D42, and a capacitor C42 are connected in series in this sequential order between the contact points b and c. A PIN diode D41 is disposed between the junction of the capacitor C41 and the $\lambda/4$ phase circuit P1 and ground. A capacitor C43 is connected between the junction of the $\lambda/4$ phase circuit P1 and the PIN diode D42 and the terminal a. A high frequency blocking circuit constituted of a $\lambda/4$ phase circuit P2, a resistor R, and a capacitor C is disposed between the junction of the PIN diode D42 and the capacitor C42 and the voltage control terminal CONT2.

In this embodiment, the switching circuit SW is not restricted to the circuit shown in FIG. 2, and can have other circuit structures using diodes, or alternatively, a GaAs switch can be used, for example.

In addition, when it is difficult to obtain a satisfactory phase synthesis with the switching circuit SW and the transmission filter, for example, a phase synthesizing element such as an inductor may be added between the antenna terminal ANT and the switching circuit SW, or inside the switching circuit SW.

Next, a description will be given of the operation of the duplexer according to this embodiment.

In this duplexer, a transmitted signal input from a transmission circuit system (not shown) to the transmission terminal Tx is output from the antenna terminal ANT via the transmission filter, and a received signal input from the antenna terminal ANT is output from the reception terminals Rx1 and Rx2 to a reception circuit system (not shown) via the reception filter.

In the transmission filter, when a positive control voltage is applied to the voltage control terminal CONT1, the PIN diodes D1 and D2 are turned on, that is, the PIN diodes D1 and D2 are in a conducting state, whereby capacitors C10 and C20 are substantially connected in parallel to the dielectric resonators R1 and R2. As a result, the frequencies of the attenuation poles of the two resonant systems in the transmission filter both become lower. In contrast, when 0V or a negative control voltage is applied to the voltage control terminal CONT1, the PIN diodes D1 and D2 are turned off, that is, the PIN diodes D1 and D2 are not in the conducting state, whereby the capacitors C10 and C20 are disconnected from the dielectric resonators R1 and R2. As a result, the frequencies of the attenuation poles of the two resonant systems in the transmission filter both become higher. Attenuation bands generated by the attenuation poles of the two resonant systems are equivalent to the transmission frequency bands. In this way, by controlling the voltage applied to the voltage control terminal CONT 1, the transmission filter is provided with two different attenuation bands.

In the reception filter, when a positive control voltage is applied to the voltage control terminal CONT2, the switching circuit SW is switched to the contact point b, and the surface acoustic wave filter SF1 is connected to the antenna terminal ANT. On the other hand, when 0V or a negative control voltage is applied to the voltage control terminal CONT2, the switching circuit SW is switched to the contact point c, and the surface acoustic wave filter SF2 is connected to the antenna terminal ANT. In this way, in the reception filter, one of the two surface acoustic wave filters is selected by controlling the voltage applied to the voltage control terminal CONT2.

Next, a description will be given of a case in which the above duplexer is applied to a Japanese cdma-One mobile phone system, in which the transmission band of the system is between 887 and 925 MHZ and the reception band thereof is between 832 and 870 MHZ.

In this case, the surface acoustic wave filter SF1 is set as a band pass filter having a frequency band: ranging from 832 to 846 MHZ, and the surface acoustic wave filter SF2 is set as a band pass filter having a frequency band ranging from 860 to 870 MHZ.

Under these circumstances, when a positive control voltage, for example, 3V, is applied to the voltage control terminal CONT1, the transmission filter blocks signals in the reception-band low-frequency passband ranging from 832 and 846 MHZ, and passes signals in the transmission-band low-frequency passband ranging from 887 to 901 MHZ. On the other hand, when 0V is applied to the voltage control terminal CONT1, the transmission filter blocks signals in the reception-band high-frequency passband ranging from 860 to 870 MHZ, and passes signals in the transmission-band high-frequency passband ranging from 915 to 925 MHZ.

Further, when a positive control voltage, for example, 3V is applied to the voltage control terminal CONT2, the surface acoustic wave filter SF1 is selected in the reception filter to pass signals in the reception-band low-frequency passband ranging from 832 to 846 MHZ. In contrast, when 0V is applied to the voltage control terminal CONT2, the surface acoustic wave filter SF2 is selected in the reception filter to pass signals of the reception-band high-frequency passband ranging from 860 to 870 MHZ.

In this duplexer, the voltage control terminals CONT1 and CONT2 control voltages in sync with each other. With this synchronized voltage control, the separation between the transmission band of the transmission filter and the reception band of the reception filter can be broadened, to be 41 MHZ when a positive control voltage is applied to CONT1 and CONT2; and 45 MHZ when 0V is applied to CONT1 and CONT2. In addition, the block bands and pass bands of the transmission filter and the reception filter are each set to be approximately half the frequency band of the communication system so that the filters can have narrow bands. As a result, phase synthesis between the transmission filter and the reception filter can be easily and satisfactorily performed.

Thus, deterioration of insertion losses due to mismatching of the phase synthesis can be suppressed. Moreover, the problem of limits to broadening of frequency bands in the surface acoustic wave filter can be solved by using the plurality of surface acoustic wave filters.

Figure 3:
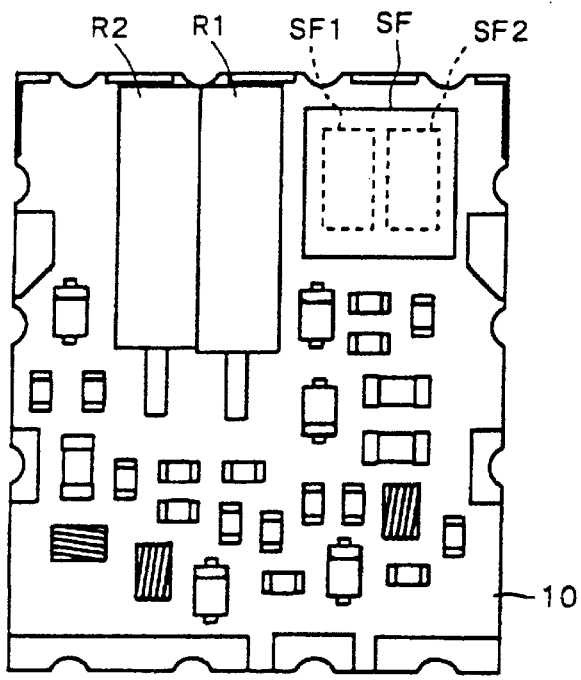
FIG. 3 is a plan view showing the structure of the duplexer according to the first embodiment.

The duplexer of the present invention, for example, as shown in FIG. 3, may be manufactured by disposing or mounting all of the components on a single substrate 10 and attaching a case (not shown) to the substrate, or by integrating the components into the case. On the lower surface of the substrate 10, terminals are formed, whereby components can be mounted on the lower surface. In FIG. 3, reference numerals correspond to those shown in FIG. 1.

Specifically, the dimensions of the dielectric resonators R1 and R2 are approximately 2×2×7 mm. Regarding the surface acoustic wave filter device SF, two surface acoustic wave filters SF1 and SF2 are contained in a single package. The structure of the surface acoustic wave filter device SF includes the two input terminals and two output terminals of the independent surface acoustic wave filters SF1 and SF2 disposed therein. The surface acoustic wave filter device SF has dimensions of approximately 3.8×3.8×2.0 mm.

In this way, since the dielectric resonators and the surface acoustic wave filters forming the duplexer are integrated into a single structure, easy handling can be achieved, and stable and satisfactory characteristics can be obtained.

The first embodiment has two voltage control terminals CONT1 and CONT2. However, the two voltage control terminals CONT1 and CONT2 may be connected to each other to form a single voltage control terminal.

Figure 4:
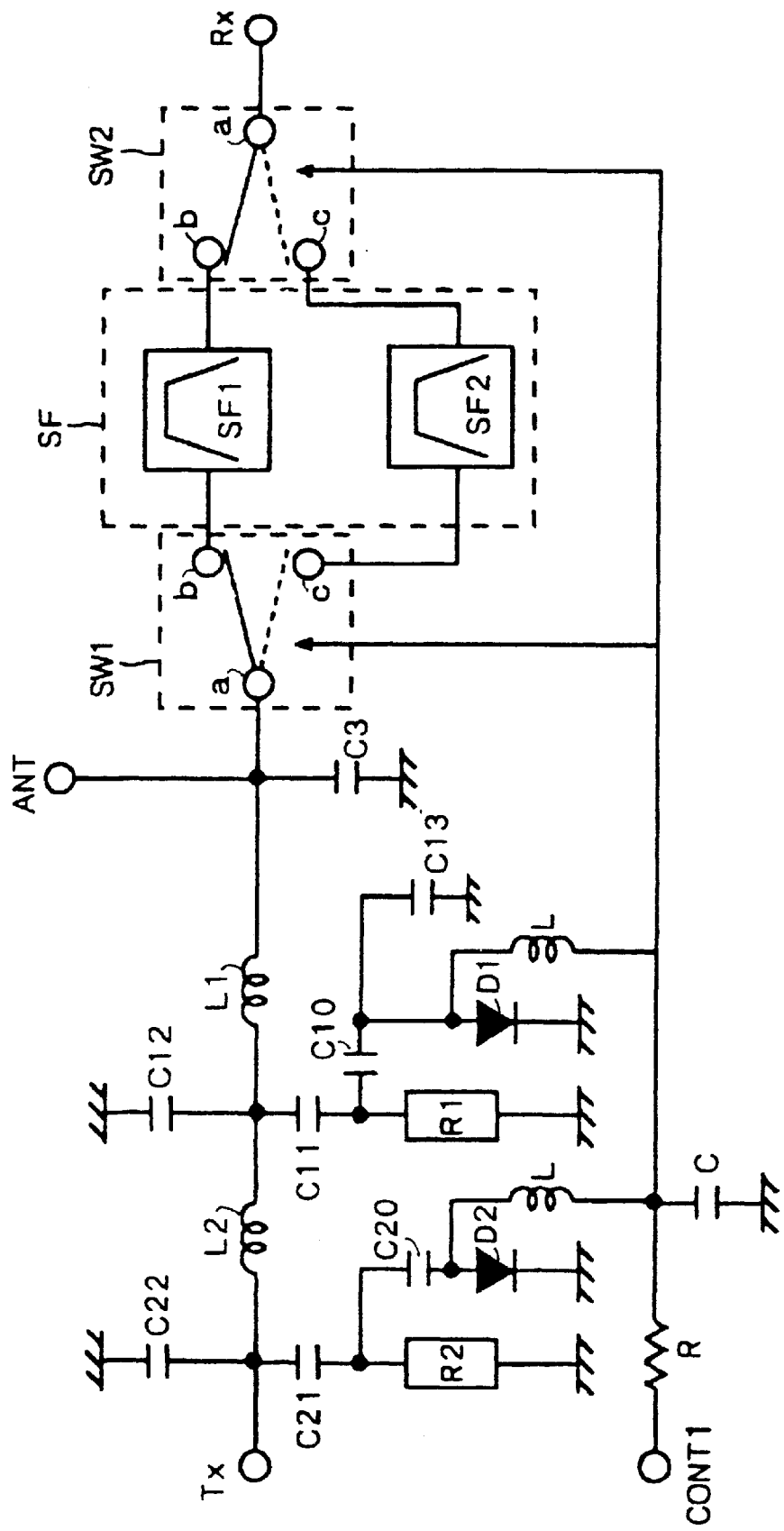
FIG. 4 is a circuit: diagram of a duplexer according to a second embodiment of the present invention.

Next, FIG. 4 shows a duplexer according to a second embodiment of the present invention.

In the first embodiment, the switching circuit SW is disposed only on the input sides of the surface acoustic wave filters SF1 and SF2. However, in the duplexer shown in FIG. 4, a first switching circuit SW1 is disposed on the input side of a surface acoustic wave filter device SF and a second switching circuit SW2 is disposed on the output side thereof.

In this case, the reception filter can have a single reception terminal Rx. In addition, in the second embodiment, the duplexer has a single voltage control terminal CONT1.

Figure 5:
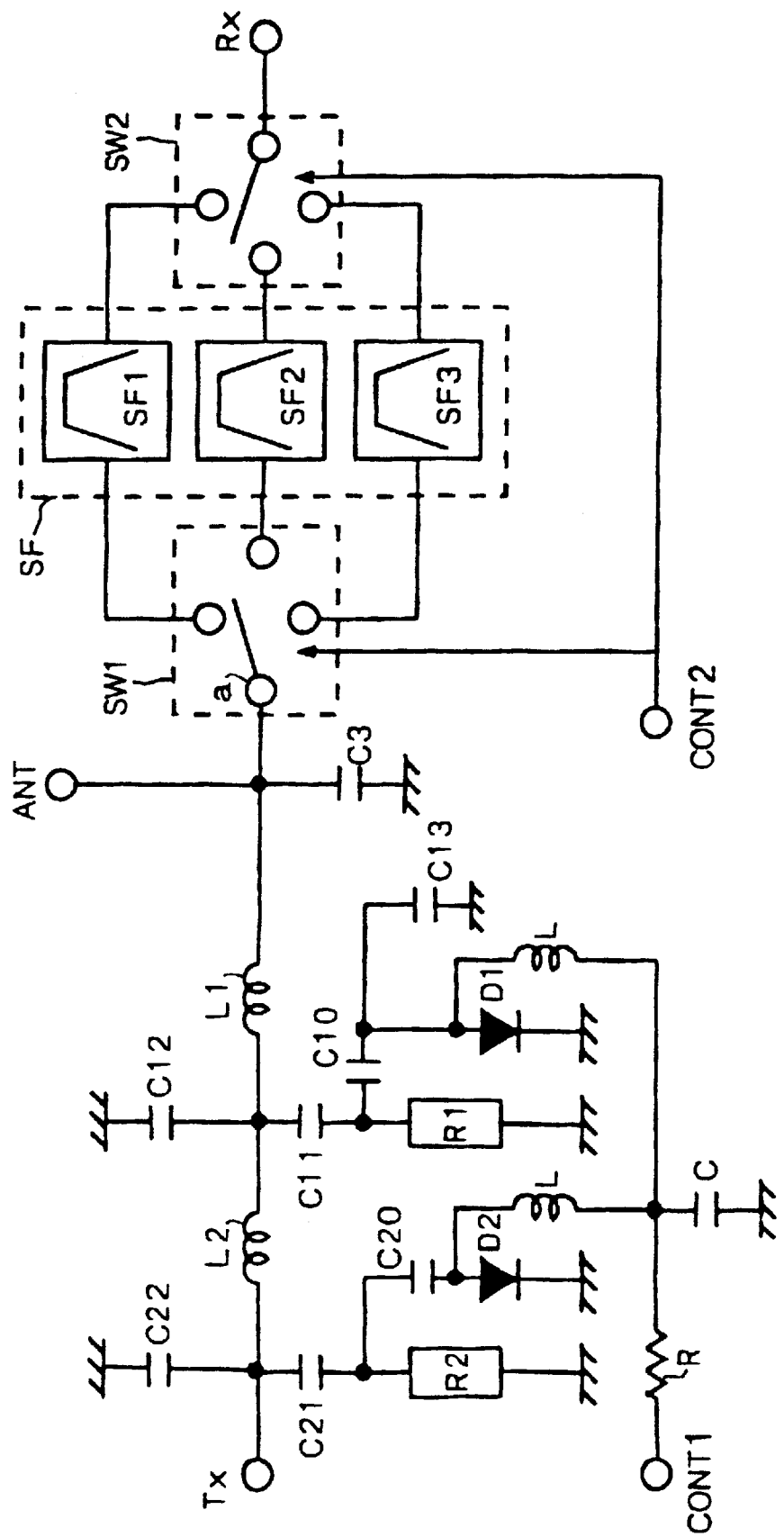
FIG. 5 is a circuit diagram of a duplexer according to a third embodiment of the present invention.

Next, FIG. 5 shows a duplexer according to a third embodiment of the present invention.

In the duplexer shown in FIG. 5, three surface acoustic wave filters SF1, SF2, and SF3 are used in a reception filter. In addition, switching circuits SW1 and SW2 capable of performing switching between three contact points in response to control voltages are disposed on the inputs and outputs of the surface acoustic wave filters SF1, SF2, and SF3. When a specified voltage is applied to a voltage control terminal CONT2 of the switching circuits SW1 and SW2, one of the surface acoustic wave filters can be selected. The surface acoustic wave bandpass filters SF1, SF2, and SF3 divide the reception band of a communication system into three bands and pass signals in one of the three frequency bands.

With this arrangement, surface acoustic wave filters having narrow bands and satisfactory characteristics can be used. In addition, the surface acoustic wave filters can also be used in communication systems having broader frequency bands.

However, the present invention is not limited to the embodiments described above.

For example, in the above embodiments, the band-elimination-type variable frequency filters are used in the transmission filters. Alternatively, band-pass-type variable frequency filters may be used in the transmission filters. Moreover, the number of dielectric resonators forming the variable frequency filter and the circuit structures are not restricted to those used in the above embodiments. Further, the transmission band may be divided into three or more passbands, rather than two passbands as shown herein. In addition, as impedance elements, variable-capacitance diodes, such as varactor diodes, or field-effect transistors (FET) may be used instead of the PIN diodes.

Furthermore, in each of the above embodiments, the first filter (the variable frequency filter) is described as the transmission filter and the second filter (having the surface acoustic wave filters) is described as the reception filter. However, when the invention is applied to a low power communication system, the first filter may be used as a reception filter and the second filter may be used as a transmission filter.

Figure 6:
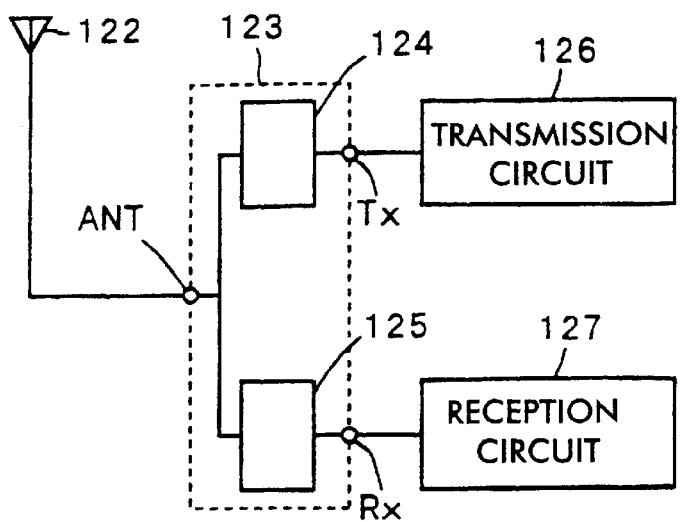
FIG. 6 is a block diagram of a communication apparatus according to a fourth embodiment of the present invention.

FIG. 6 shows a structure of a communication apparatus according to a fourth embodiment of the present invention.

In FIG. 6, reference numeral 122 denotes an antenna, reference numeral 123 denotes a duplexer, reference numeral 124 denotes a transmission filter, reference numeral 125 denotes a reception filter, reference numeral 126 denotes a transmission circuit, and reference numeral 127 denotes a reception circuit. An antenna terminal ANT of the duplexer 123 is connected to the antenna 122, a transmission terminal Tx is connected to the transmission circuit 126, and a reception terminal Rx is connected to the reception circuit 127. This arrangement permits a communication apparatus to be formed.

In this case, as the duplexer 123, the duplexer of each of the embodiments can be used. With the use of the duplexer according to the present invention, a compact communication apparatus having satisfactory characteristics can be obtained.

As described above, with the duplexer according to the present invention, the frequency pass bands of the transmission and reception filters are controlled so as to narrow the transmission and reception bands while broadening the separation between the transmission band and the reception bands.

In the arrangement of the duplexer, the variable frequency filter including dielectric resonators is used in a first filter, and a plurality of surface acoustic wave filters are used in a second filter so that the size of the duplexer can be reduced. In addition, in the second filter, since the surface acoustic wave filters having narrow bands can be used, the phase synthesis with the first filter can be facilitated, whereby satisfactory transmission/reception characteristics can be obtained.

With the use of the duplexer according to the present invention, a compact communication apparatus with satisfactory characteristics can be obtained.

Although the present invention has been described in relation to particular embodiments thereof, many other variations and modifications and other uses will become apparent to those skilled in the art. Therefore, the present invention is not limited by the specific disclosure herein.

What is claimed is:

1. A duplexer comprising:
    a first filter including a variable frequency filter formed by connecting a variable impedance element to a dielectric resonator; and
    a second filter including a plurality of surface acoustic wave filters having different frequency pass bands and a switching circuit connected to the inputs of the surface acoustic wave filters for selecting one of the plurality of surface acoustic wave filters;
    a first input/output terminal connected to said first filter;
    a second input/output terminal connected to said second filter; and
    a common input/output terminal connected to both of said first and second filters.

2. A duplexer according to claim 1, wherein the first filter is a transmission filter and the second filter is a reception filter.

3. A duplexer according to claim 1, wherein the first filter is a band elimination filter and the second filter is a band pass filter.

4. A duplexer according to claim 1, wherein the variable impedance element of the first filter is a PIN diode.

5. A duplexer according to claim 1, wherein the switching circuit of the second filter comprises a PIN diode.

6. A duplexer according to claim 1, wherein the switching circuit of the second filter comprises a GaAs switch.

7. A duplexer according to claim 1, wherein the variable frequency filter is formed by connecting the variable impedance element for receiving a control voltage via a reactance element.

8. A duplexer according to claim 1, wherein the variable frequency filter is formed by connecting each of a plurality of dielectric resonators to a respective variable impedance element.

9. A duplexer according to claim 1, further comprising:
    a first control terminal for controlling a frequency of the variable frequency filter included in the first filter; and
    a second control terminal for controlling the switching circuit included in the second filter.

10. A duplexer according to claim 1, wherein the switching circuit is further connected to the outputs of the surface acoustic wave filters.

11. A duplexer according to claim 1, further comprising a common control terminal for controlling both the frequency of the variable frequency filter included in the first filter and the switching circuit included in the second filter.

12. A duplexer according to claim 1, wherein the first filter and the second filter are disposed on the same substrate.

13. A communication apparatus comprising the duplexer according to claim 1;

a transmission circuit connected to one of said first and second input/output terminals; and a reception circuit connected to the other of said first and second input/output terminals.

* * * * *